United States Patent
Luo

(10) Patent No.: US 10,851,292 B2
(45) Date of Patent: Dec. 1, 2020

(54) DARK BLUE LIGHT THERMALLY ACTIVATED DELAYED FLUORESCENCE (TADF) MATERIAL AND APPLICATION THEREOF

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/484,194

(22) PCT Filed: Jan. 10, 2019

(86) PCT No.: PCT/CN2019/071069
§ 371 (c)(1),
(2) Date: Aug. 7, 2019

(87) PCT Pub. No.: WO2020/098138
PCT Pub. Date: May 22, 2020

(65) Prior Publication Data
US 2020/0224089 A1    Jul. 16, 2020

(30) Foreign Application Priority Data

Nov. 15, 2018  (CN) .......................... 2018 1 1363314

(51) Int. Cl.
*C09K 11/06* (2006.01)
*C07F 9/64* (2006.01)
*H01L 51/00* (2006.01)
*H01L 51/50* (2006.01)

(52) U.S. Cl.
CPC ............. *C09K 11/06* (2013.01); *C07F 9/64* (2013.01); *H01L 51/0072* (2013.01); *H01L 51/0094* (2013.01); *C09K 2211/1007* (2013.01); *C09K 2211/1014* (2013.01); *C09K 2211/1018* (2013.01); *H01L 51/5012* (2013.01)

(58) Field of Classification Search
CPC ................................. C09K 11/06; C07F 9/64
USPC ................................................... 546/23
See application file for complete search history.

(56) References Cited

PUBLICATIONS

Bergstraesser et al., Science of Synthesis (2005), 15, 1181-1190.*

* cited by examiner

*Primary Examiner* — Niloofar Rahmani

(57) ABSTRACT

The present invention provides a thermally activated delayed fluorescence (TADF) material, which is composed of a molecular compound having an ultra-fast reverse inter-system crossing rate, and when the TADF material serves as a host material in light-emitting layers of electroluminescent devices, both the resulting blue light fluorescence device and phosphorescent electroluminescent device can achieve very high efficiency.

9 Claims, 5 Drawing Sheets

DARK BLUE LIGHT THERMALLY ACTIVATED DELAYED FLUORESCENCE (TADF) MATERIAL AND APPLICATION THEREOF

RELATED APPLICATIONS

This application is a National Phase of PCT Patent Application No. PCT/CN2019/071069 having International filing date of Jan. 10, 2019, which claims the benefit of priority of Chinese Patent Application No. 201811363314.2 filed on Nov. 15, 2018. The contents of the above applications are all incorporated by reference as if fully set forth herein in their entirety.

FIELD AND BACKGROUND OF THE INVENTION

The invention relates to material fields for flat display devices, and in particular, to a dark blue light thermally activated delayed fluorescence material and a preparation method thereof.

It is known that organic light-emitting diodes (OLEDs) have attracted the attention of many researchers, due to their huge application prospects and advantages, such as self-illumination without the need for a backlight, high luminous efficiency, large viewing angles, fast response speed, large temperature adaptation range, and relatively simple production and processing techniques, low driving voltage, low energy consumption, lightness and thinness, flexibility, and so on. In OLEDs, the dominant luminescent guest material is critical.

Guest luminescent materials for early OLEDs are fluorescence materials. Because the ratio of excitons in singlet energy state and excitons in triplet energy state in the OLED is 1:3, the theoretical internal quantum efficiency (IQE) of fluorescence-based OLEDs can merely reach 25%, thus considerably limiting the application of fluorescence electroluminescent devices. Heavy metal complex phosphorescent materials can achieve 100% IQE by using the excitons in singlet energy state and the excitons in triplet energy state due to spin-orbit coupling of heavy atoms. However, the heavy metals commonly employed are precious metals such as Ir, Pt, and the like, and the heavy metal complex phosphorescent materials have yet to be developed in fields of blue light materials.

Through molecular design, pure organic thermally activated delayed fluorescence (TADF) materials can have a small minimum energy level difference (ΔEST) between singlet energy state and triplet energy state, so that excitons in triplet energy state can be returned by reverse intersystem crossing (RISC) back to singlet energy state, then to the ground state by radiation transition to emit light, and thereby simultaneously use excitons in singlet energy state and in triplet energy state, and 100% IQE may be also achieved.

For TADF materials, the fast reverse intersystem crossing constant (kRISC) and high photoluminescence quantum yield (PLQY) are necessary for a preparation of high efficiency OLEDs. At present, TADF materials with the above conditions are still relatively scarce compared to heavy metal Ir complexes, especially in the dark blue light field where phosphorescent heavy metal materials have yet to be developed, and there are few TADF materials.

Therefore, the design and synthesis of new dark blue TADF polymers is of great significance for the wide application of TADF materials.

SUMMARY OF THE INVENTION

An aspect of the present invention is to provide a thermally activated delayed fluorescence (TADF) material, which is composed of a molecular compound having an ultra-fast reverse intersystem crossing rate and when it serves as a host dopant in light-emitting layers of electroluminescent devices, both the resulting blue light fluorescence device and phosphorescent electroluminescent device can achieve very high efficiency.

The technical solution adopted by the present invention is as follows:

A dark blue light thermally activated delayed fluorescence (TADF) material; comprising a Compound 1 having a molecular structure as follows:

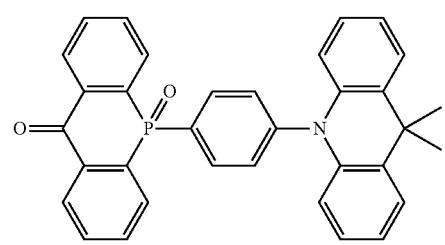

1

Further, in various embodiments, the Compound 1 is synthesized by reacting an intermediate with 9,10-dihydro-9,9-dimethylacridine, wherein a molecular structure of the intermediate is as follows:

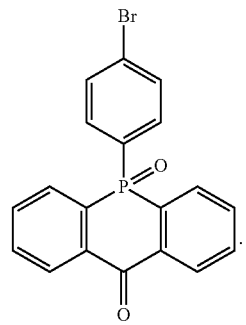 [SMILES: O=C1c2ccccc2P(=O)(c2ccc(Br)cc2)c2ccccc21]

Furthermore, in various embodiments, the Compound 1 is synthesized by a reaction scheme as follows:

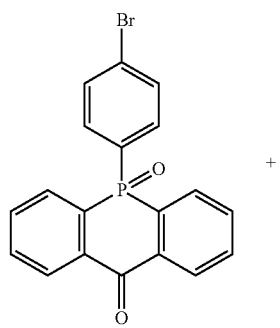

+

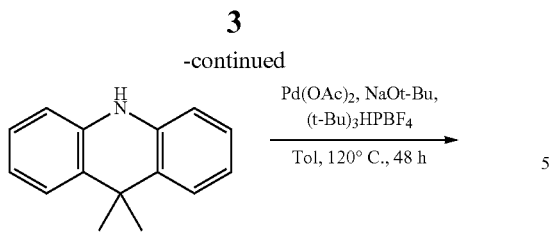

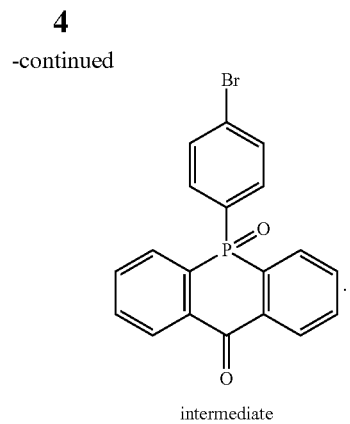

intermediate

Further, in various embodiments, the 9,10-dihydro-9,9-dimethyl acridine is derivatized as 9,10-dihydro-9,9-diphenyl acridine, which is reacted with the intermediate such that the Compound 1 is derivatized as a Compound 2 having a molecular structure as follows:

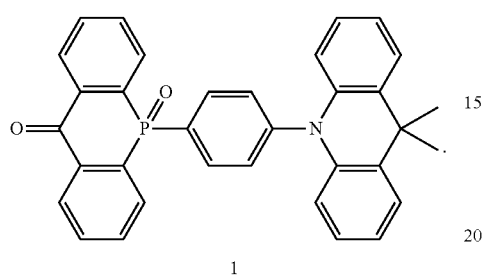

1

In addition, in various embodiments, the intermediate is synthesized from 4-bromophosphonone, with a molecular structure as follows:

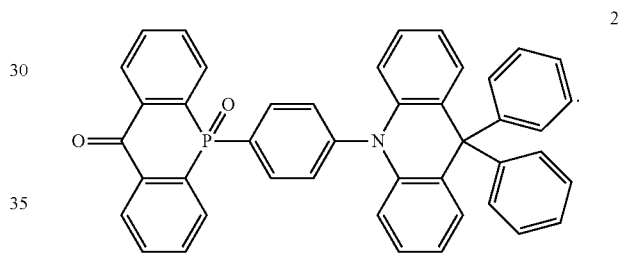

2

Further, in various embodiments, the Compound 2 is synthesized by a reaction scheme as follows:

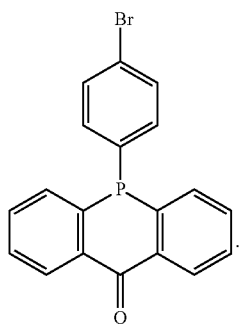 [SMILES: O=c1c2ccccc2p(-c2ccc(Br)cc2)c2ccccc12]

Further, in various embodiments, the intermediate is synthesized by a reaction scheme as follows:

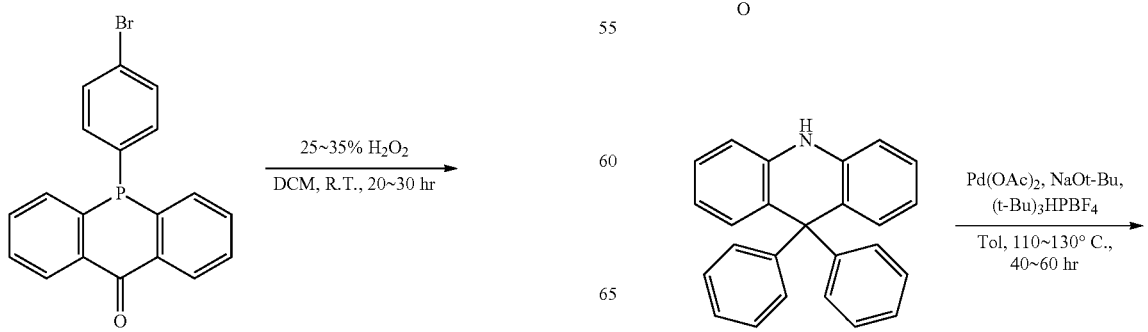

-continued

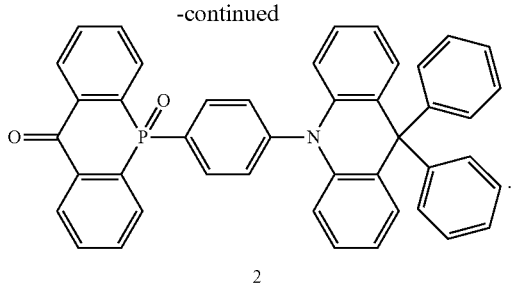

2

Further, in various embodiments, the 9,10-dihydro-9,9-dimethyl acridine is derivatized as 9,10-dihydro-9,9-diphenylsilyl acridine, which is reacted with the intermediate such that the Compound 1 is derivatized as a Compound 3 having a molecular structure as follows:

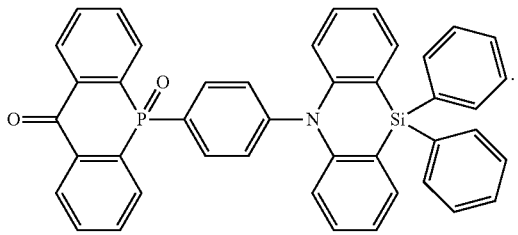

3

Further, in various embodiments, the Compound 3 is synthesized by a reaction scheme as follows:

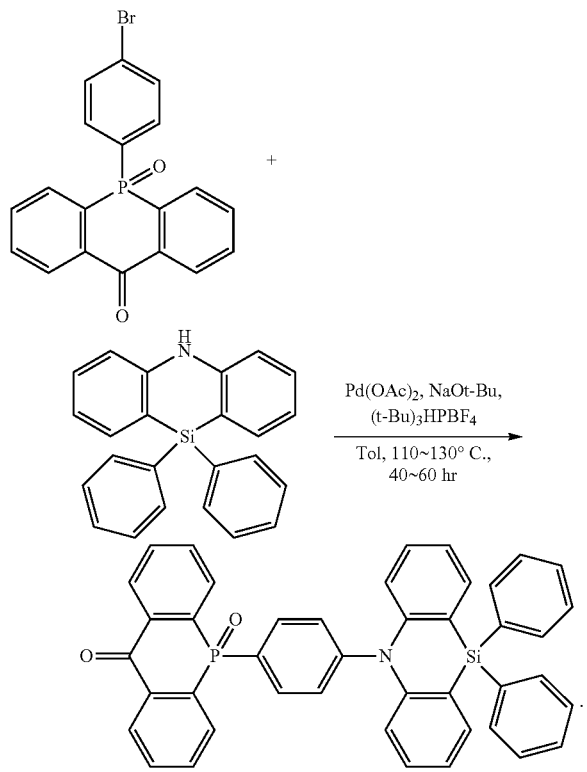

3

Further, the present invention discloses the three compounds, although the molecular structures of the three compounds are slightly different, but they are all made according to one creative concept, and the basic raw materials and intermediates involved are also consistent. Although acridine materials used in their subsequent synthesis are different, they are also similar derivatives. Therefore, the three different compounds involved in the present invention belong to the same inventive concept and possess unity.

Furthermore, another aspect of the invention provides a method for preparing the Compound 1 according to the invention, which comprises the following steps:

adding 4-bromophosphonone and dichloromethane (DCM) and 25-35 wt % of a hydrogen peroxide solution to the reaction flask, followed by reaction at room temperature for 20 to 30 hours;

pouring the reaction solution into an ice water, followed by filtration to obtain an off-white solid, which is then dissolved in methylene chloride and spun into a silica gel, and separation and purification are performed by a column chromatography to obtain a white powdery intermediate;

adding the intermediate, 9,10-dihydro-9,9-dimethylacridine, palladium acetate and tri-tert-butylphosphine tetrafluoroborate to a reaction flask, followed by adding NaOt-Bu in a glove box, and introducing deoxygenated and dehydrated toluene into the reaction solution under an inert gas (for example, argon) atmosphere to react at 110~130° C. for 40~60 hours; and cooling the reaction solution to a room temperature, then pouring the reaction solution into ice water followed by extraction with dichloromethane for 3 to 5 times, combined with the organic phase and spun into a silica gel, and separation and purification are performed by a column chromatography to obtain the Compound 1 of blue-white powder.

In addition, a further aspect of the invention provides a method for preparing the Compound 2 according to the invention, which comprises the following steps:

adding 4-bromophosphonone and dichloromethane (DCM) and 25-35 wt % of a hydrogen peroxide solution to the reaction flask, followed by reaction at room temperature for 20 to 30 hours;

pouring the reaction solution into an ice water, followed by filtration to obtain an off-white solid, which is then dissolved in methylene chloride and spun into a silica gel, and separation and purification are performed by a column chromatography to obtain a white powdery intermediate;

adding the intermediate, 9,10-dihydro-9,9-diphenyl acridine, palladium acetate and tri-tert-butylphosphine tetrafluoroborate to the reaction flask, followed by adding NaOt-Bu in a glove box, and introducing deoxygenated and dehydrated toluene into the reaction solution under an inert gas (for example, argon) atmosphere to react at 110~130° C. for 40~60 hours; and cooling the reaction solution to a room temperature, then pouring the reaction solution into ice water followed by extraction with dichloromethane for 3 to 5 times, combined with the organic phase and spun into a silica gel, and separation and purification are performed by a column chromatography to obtain the Compound 3 of blue-white powder.

A still further aspect of the invention provides a method for preparing the Compound 3 according to the invention, which comprises the following steps:

adding 4-bromophosphonone and dichloromethane (DCM) and 25-35 wt % of a hydrogen peroxide solution to a reaction flask, followed by reaction at room temperature for 20 to 30 hours;

pouring the reaction solution into an ice water, followed by filtration to obtain an off-white solid, which is then dissolved in methylene chloride and spun into a silica gel, and separation and purification are performed by a column chromatography to obtain a white powdery intermediate;

adding the intermediate, 9,10-dihydro-9,9-diphenylsilyl acridine, palladium acetate and tri-tert-butylphosphine tetrafluoroborate to the reaction flask, followed by adding NaOt-Bu in a glove box, and introducing deoxygenated and dehydrated toluene into the reaction solution under an inert gas (for example, argon) atmosphere to react at 110~130° C. for 40~60 hours; and cooling the reaction solution to a room temperature, then pouring the reaction solution into ice water followed by extraction with dichloromethane for 3 to 5 times, combined with the organic phase and spun into a silica gel, and separation and purification are performed by a column chromatography to obtain the Compound 3 of blue-white powder.

Further, still another aspect of the present invention provides an electroluminescent device comprising a light emitting layer. The material of the light-emitting layer includes at least one of the Compound 1, the Compound 2 and the Compound 3 according to the present invention.

Compared to the prior art, the present invention has the beneficial effects that the present invention can reduce lowest single triplet energy state difference and high energy level of the target molecule by selecting different electron donor units, and adjusting a twist angle between an electron donor and an electron acceptor and adjusting charge transfer characteristics, thereby providing ultra-fast reverse intersystem crossing rate to the molecules of the target Compound 1, the target Compound 2, and the target Compound 3 involved in the present invention. When the above compounds are used as a host dopant in a light-emitting layer of an application device, the resulting blue light fluorescence and phosphorescent electroluminescent devices can achieve very high efficiency.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

With reference to the appended drawings, exemplary embodiments of dark blue thermally activated delayed fluorescence materials and applications thereof according to the present invention will be described in detail below.

An embodiment of the present invention provides a dark blue light thermally activated delayed fluorescence (TADF) material, comprising a Compound 1 having a molecular structure as follows:

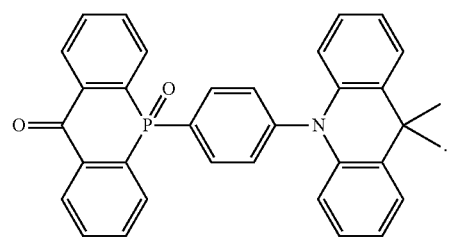

1

Further, by using starting materials with different functional groups, the Compound 1 can be derived into a Compound 2 and a Compound 3 having structural formulas respectively as follows:

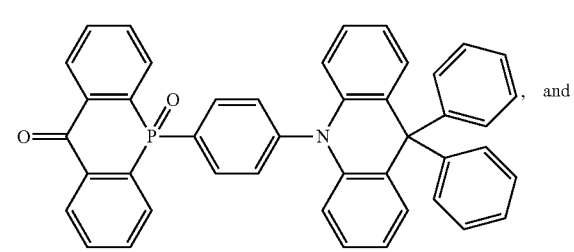

2

, and

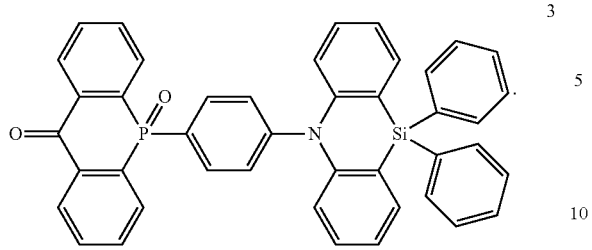

Further, please refer to FIG. 1 to FIG. 6, which illustrate the distribution of highest electron occupied orbit (HOMO) and lowest electron occupied orbit (LUMO) of the three compounds involved in the present invention.

Furthermore, the Compound 1, the Compound 2 and the Compound 3 have lowest singlet energy state (S1) and the lowest triplet energy state (T1) which are shown as follows:

| | PL Peak (nm) | $S_1$ (eV) | $T_1$ (eV) | $\Delta E_{ST}$ (eV) | HOMO (eV) | LUMO (eV) |
|---|---|---|---|---|---|---|
| Compound 1 | 405 | 3.06 | 2.97 | 0.09 | −5.35 | −2.13 |
| Compound 2 | 413 | 3.00 | 2.93 | 0.07 | −5.45 | −2.14 |
| Compound 3 | 427 | 2.91 | 2.85 | 0.06 | −5.42 | −2.13 |

Figure 1:
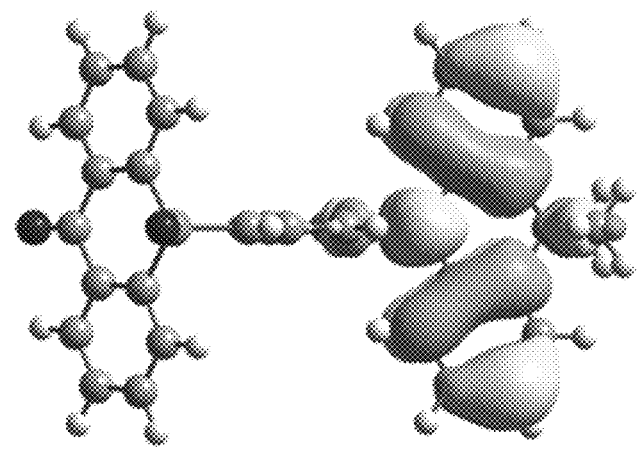
FIG. 1 is a highest electron occupied orbital (HOMO) distribution map of a dark blue thermally activated delayed fluorescence material provided by an embodiment of the present invention based on theoretical calculation, wherein the target molecular structure is Compound 1.
Figure 2:
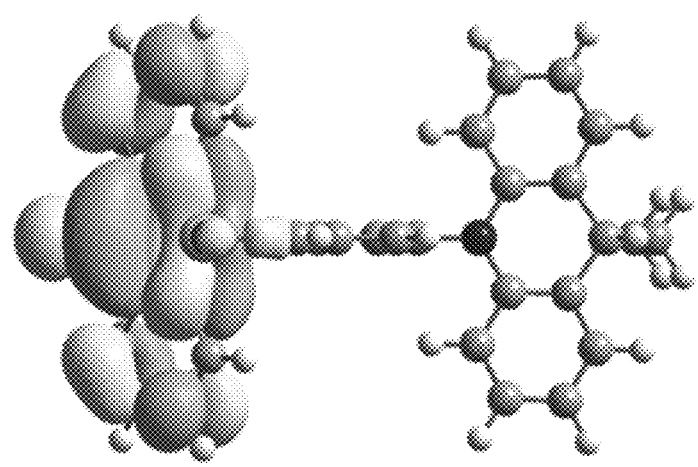
FIG. 2 is lowest electron unoccupied orbit (LUMO) distribution map of the dark blue thermally activated delayed fluorescence material shown in FIG. 1 after theoretical calculation.
Figure 3:
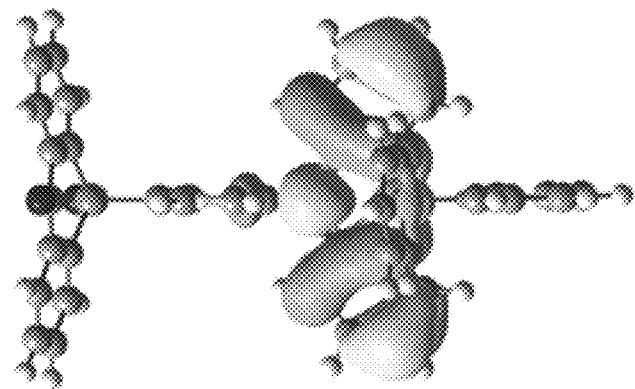
FIG. 3 is a highest electron occupied orbital (HOMO) distribution map of a dark blue thermally activated delayed fluorescence material provided by another embodiment of the present invention based on theoretical calculation, wherein the target molecular structure is to Compound 2.
Figure 4:
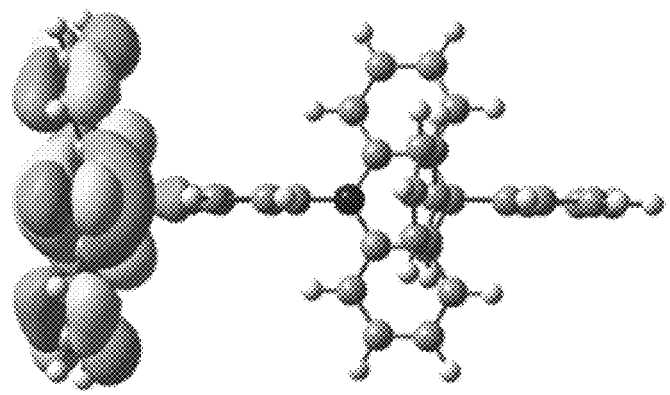
FIG. 4 is lowest electron unoccupied orbit (LUMO) distribution map of the dark blue thermally activated delayed fluorescence material shown in FIG. 3 based on theoretical calculation.
Figure 5:
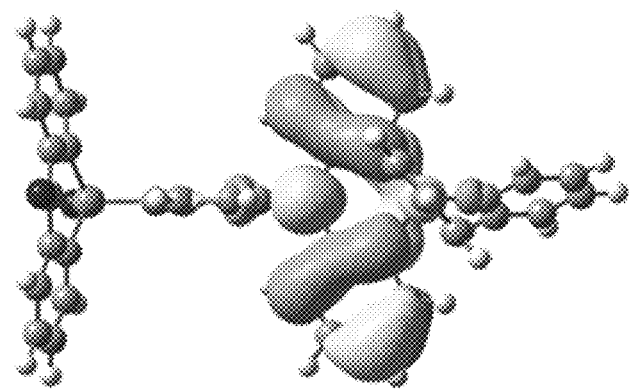
FIG. 5 is a highest electron occupied orbital (HOMO) distribution map of a dark blue thermally activated delayed fluorescence material provided by also another embodiment of the present invention base on theoretical calculation, wherein the target molecular structure is to Compound 3.
Figure 6:
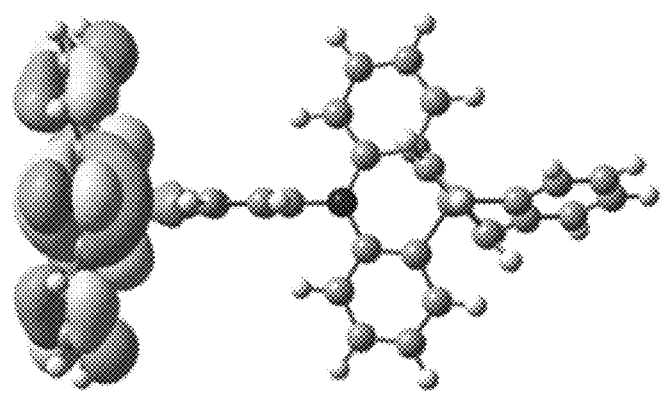
FIG. 6 is lowest electron unoccupied orbit (LUMO) distribution map of the dark blue thermally activated delayed fluorescence material shown in FIG. 5 based on theoretical calculation.
Figure 7:
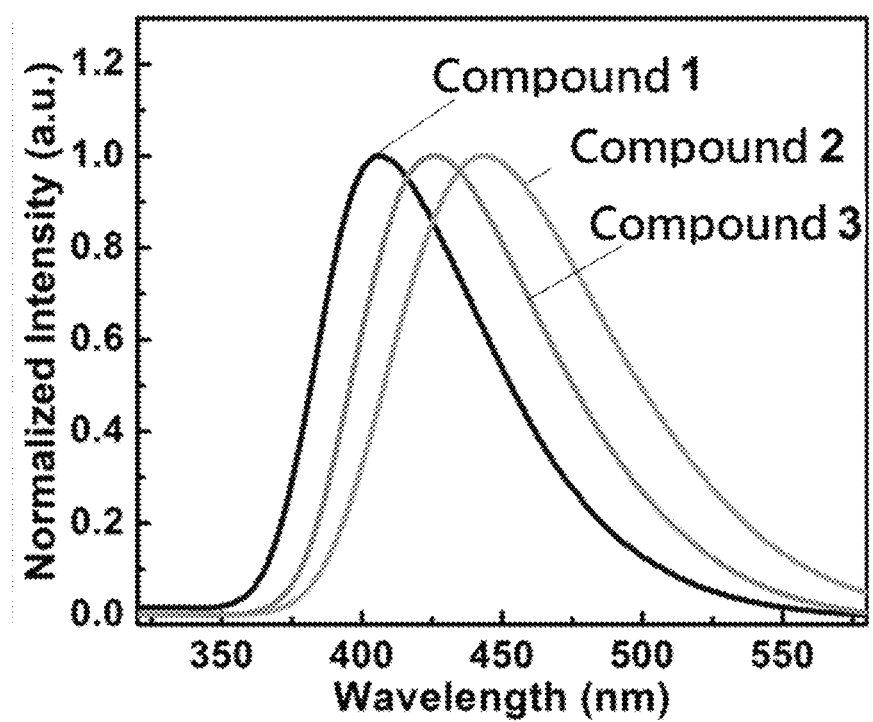
FIG. 7 is a photoluminescence spectrum of each compound in the three embodiments of the present invention in a toluene solution at room temperature.

Please refer to FIG. 7, which illustrates photoluminescence spectrums of the three different compounds according to three embodiments of the present invention in a toluene solution at room temperature.

Figure 8:
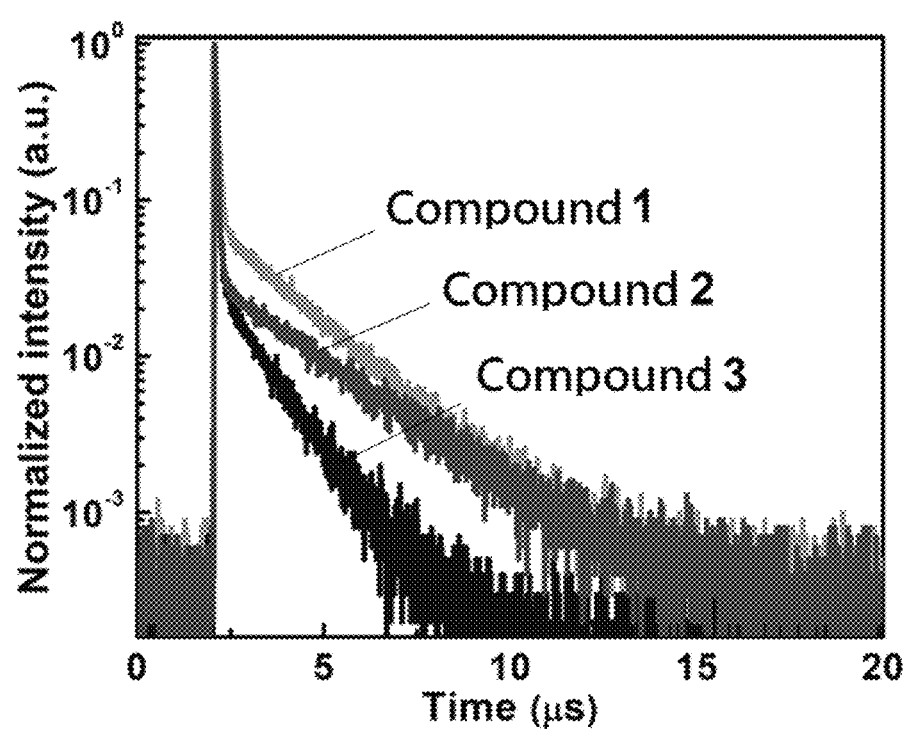
FIG. 8 is a transient photoluminescence spectrum of each compound in the three embodiments of the present invention in a toluene solution at room temperature.

Please refer to FIG. 8, which illustrates transient photoluminescence spectrums of the three different compounds according to three embodiments of the present invention in a toluene solution at room temperature.

The respective compounds will be further described in detail below in conjunction with specific preparation methods.

Compound 1 was synthesized by a reaction scheme as follows:

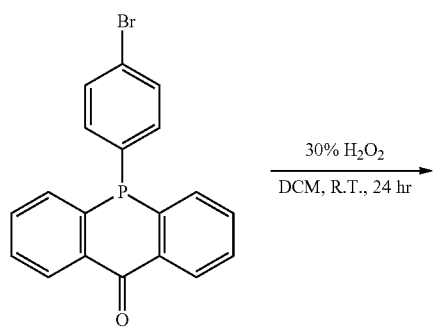

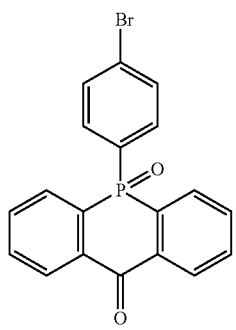

Specifically, the synthesis was divided into two stages: an intermediate synthesis stage and a Compound 1 synthesis stage.

Intermediate Synthesis Stage:

4-bromophosphonone (3.65 g, 10 mmol) was added to a 100 mL two-neck bottle, and then 60 mL of dichloromethane (DCM) and 10 mL of 30 wt % aqueous hydrogen peroxide were introduced, followed by reaction at room temperature for 24 hours.

The reaction solution was poured into 200 mL of ice water, and filtered to give an off-white solid, which was dissolved in methylene chloride and spun into a silica gel, and separation and purification were performed by a column chromatography (dichlorohexane: n-hexane, v:v, 2:1) to obtain 3.6 g of white powdery intermediate with a yield of 94%.

(1H NMR (300 MHz, CD2C12, δ): 7.94 (d, J=6.0 Hz, 2H), 7.87 (d, J=6.3 Hz, 2H), 7.77-7.70 (m, 4H), 7.38 (d, J=6.6 Hz, 2H), 7.28 (d, J=6.9 Hz, 2H). MS (EI) m/z: [M]+ calcd for C19H12BrO2P, 381.98; found, 381.87. Anal. Calcd for C19H12BrO2P: C 59.56, H 3.16; found: C59.31, H 3.07.)

Compound 1 Synthesis Stage:

Intermediate 1 (1.91 g, 5 mmol), 9,10-dihydro-9,9-dimethylacridine (1.14 g, 6 mmol), palladium acetate (45 mg, 0.2), and tri-tert-butylphosphine tetrafluoroborate (0.17 g, 0.6 mmol) were added to a 100 mL two-neck bottle), and followed by adding NaOt-Bu (0.58 g, 6 mmol) in a glove box, and introducing 40 ml of deoxygenated and dehydrated toluene into the reaction solution under an argon gas atmosphere for reaction at 120° C. for 48 hours.

After cooling the reaction solution to room temperature, the reaction solution was poured into 50 mL of ice water, extracted with dichloromethane three times, combined with the organic phase and spun into a silica gel, and separation and purification were performed by a column chromatography (dichloromethane: n-hexane, v:v, 2:1) to obtain 1.8 g of the Compound 1 of blue-white powder with a yield of 58%.

(1H NMR (300 MHz, CD2C12, δ): 7.94 (d, J=6.0 Hz, 2H), 7.87 (d, J=6.3 Hz, 2H), 7.77-7.70 (m, 4H), 7.38 (d, J=6.6 Hz, 2H), 7.19-7.14 (m, 8H), 6.95 (d, J=6.0 Hz, 2H), 1.69 (s, 6H). MS (EI) m/z: [M]+ calcd for C34H26NO2P, 511.17; found, 511.09. Anal. Calcd for C34H26NO2P: C 79.83, H 5.12, N 2.74; found: C 79.67, H 5.07, N 2.62.)

The synthesis of each of Compound 2 and the Compound 3 was also divided into two stages: an intermediate synthesis stage and a compound synthesis stage. Since the structure of the starting material and the final intermediate involved in the intermediate synthesis stage was identical to the intermediate of the Compound 1, only the synthesis stages of the Compound 2 and the Compound 3 will be described below in order to avoid unnecessary repetitions.

The synthetic reaction scheme of the Compound 2 was as follows:

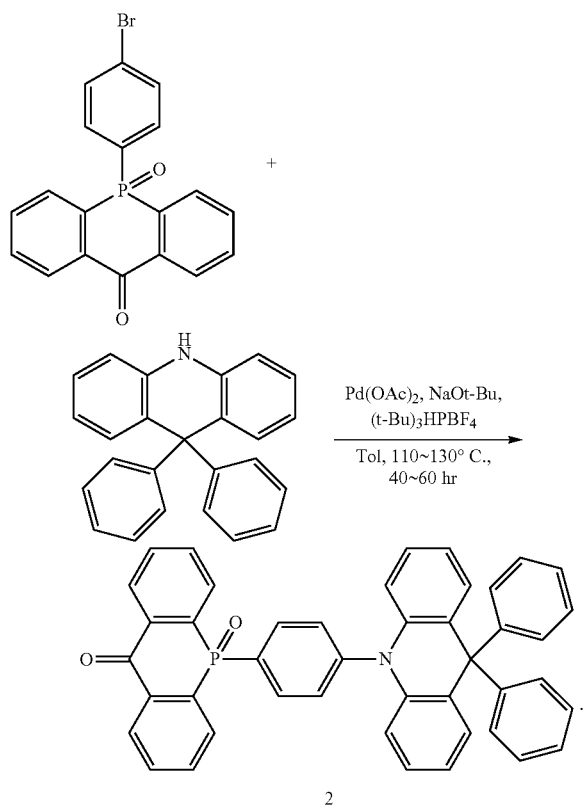

A specific reaction scheme includes the following step.

Intermediate 1 (1.91 g, 5 mmol), 9,10-dihydro-9,9-diphenyl acridine (2.00 g, 6 mmol), palladium acetate (45 mg, 0.2), and tri-tert-butylphosphine tetrafluoroborate (0.17 g, 0.6 mmol) were added to a 100 mL two-neck bottle), and followed by adding NaOt-Bu (0.58 g, 6 mmol) in a glove box, and introducing 40 ml of deoxygenated and dehydrated toluene into the reaction solution under an argon gas atmosphere for reaction at 120° C. for 48 hours.

After cooling the reaction solution to room temperature, the reaction solution was poured into 50 mL of ice water, extracted with dichloromethane three times, combined with the organic phase and spun into a silica gel, and separation and purification are performed by a column chromatography (dichloromethane: n-hexane, v:v, 2:1) to obtain 2.4 g of the Compound 2 of blue-white powder with a yield of 76%.

(1H NMR (300 MHz, CD2C12, δ): 7.94 (d, J=6.0 Hz, 2H), 7.87 (d, J=6.3 Hz, 2H), 7.77-7.70 (m, 4H), 7.38 (d, J=6.6 Hz, 2H), 7.19-7.00 (m, 16H), 6.95-6.87 (m, 4H). MS (EI) m/z: [M]+ calcd for C44H30NO2P, 635.20; found, 635.09. Anal. Calcd for C44H30NO2P: C 83.13, H 4.76, N 2.20; found: C 83.00, H 4.66, N 2.12.)

Compound 3 was synthesized by a reaction scheme as follows:

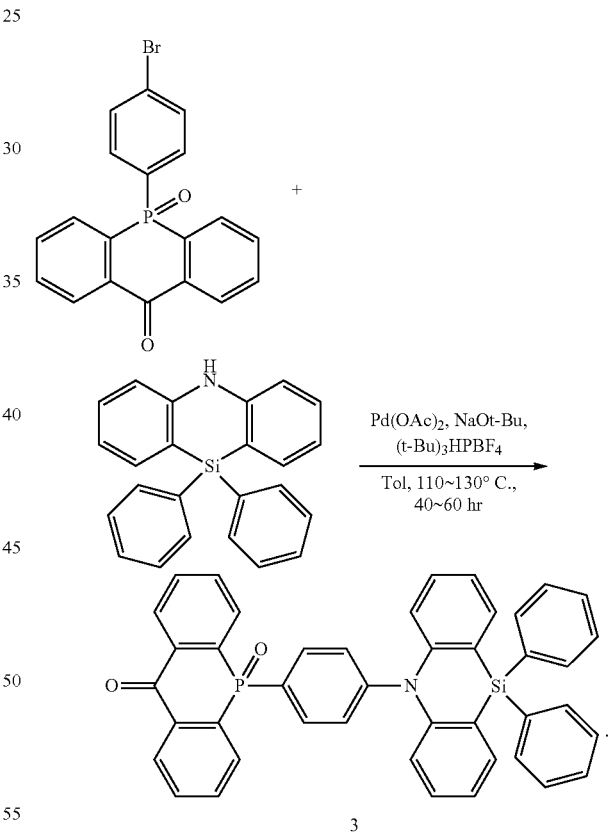

Intermediate 1 (1.91 g, 5 mmol), 9,10-dihydro-9,9-diphenylsilyl acridine (2.00 g, 6 mmol), palladium acetate (45 mg, 0.2 mmol) and tri-tert-butylphosphine tetrafluoroborate (0.17 g, 0.6 mmol) were added to a 100 mL two-neck bottle), and followed by adding NaOt-Bu (0.58 g, 6 mmol) in a glove box, and introducing 40 ml of deoxygenated and dehydrated toluene into the reaction solution under an argon gas atmosphere for reaction at 120° C. for 48 hours.

After cooling the reaction solution to room temperature, the reaction solution was poured into 50 mL of ice water, extracted with dichloromethane three times, combined with the organic phase and spun into a silica gel, and separation and purification are performed by a column chromatography (dichloromethane: n-hexane, v:v, 3:1) to obtain 2.1 g of the Compound 3 of blue-white powder with a yield of 66%.

(1H NMR (300 MHz, CD2C12, δ): 7.94 (d, J=6.0 Hz, 2H), 7.87 (d, J=6.3 Hz, 2H), 7.77-7.60 (m, 12H), 7.50-7.38 (m, 10H), 7.26 (d, J=6.9 Hz, 2H), 6.97 (d, J=6.3 Hz, 2H). MS (EI) m/z: [M]+ calcd for C43H30NO2PSi, 651.18; found, 651.09. Anal. Calcd for C43H30NO2PSi: C 79.24, H 4.64, N 2.15; found: C 79.10, H 4.60, N 2.12.)

Furthermore, the dark blue thermally activated delayed fluorescence material according to the present invention can be used to constitute a light-emitting layer in an electroluminescent device.

In an specific embodiment, the electroluminescent device comprises a glass and electrically conductive glass (ITO) substrate layer, a hole transport and injection layer (poly 3,4-ethylenedioxythiophene: polystyrene sulfonate, PEDOT:PSS), a light-emitting layer 3 (i.e., the delayed fluorescence host material and the blue phosphorescent guest Firpic of the present invention), an electron transport layer (1,3,5-tris(3-(3-pyridyl)phenyl)benzene Tm3PyPB), and a cathode layer (lithium fluoride/aluminum).

Further, in a specific method of preparing the above electroluminescent device, PESOT: PSS, the thermally activated delayed fluorescence host and phosphorescent guest may be sequentially spin-coated on a cleaned conductive glass (ITO) substrate, and then TmPyPB, 1 nm of LiF, and 100 nm of Al were sequentially deposited under high vacuum.

Further, the electroluminescent devices were respectively combined with the Compound 1, the Compound 2 and the Compound 3 according to the invention, and the obtained specific devices have structures as follows:

Device 1:
ITO/PEDOT:PSS (50 nm)/Compound 1: Firpic (5% 40 nm)/TmPyPB (40 nm)/LiF (1 nm)/Al (100 nm)

Device 2:
ITO/PEDOT:PSS (50 nm)/Compound 2: Firpic (5% 40 nm)/TmPyPB (40 nm)/LiF (1 nm)/Al (100 nm)

Device 3:
ITO/PEDOT:PSS (50 nm)/Compound 3: Firpic (5% 40 nm)/TmPyPB (40 nm)/LiF (1 nm)/Al (100 nm)

Further, each of the above electroluminescent devices was subjected to a performance measurement, wherein the current-brightness-voltage characteristics of the device were completed by a Keithley source measurement system (Keithley 2400 Sourcemeter, Keithley 2000 Currentmeter) with a corrected silicon photodiode. The electroluminescence spectrum was measured by a French JY SPEX CCD3000 spectrometer, and all measurements were performed at room temperature in the atmosphere.

The performance data of the devices were shown in the following table.

| Device | Maximum brightness (cd/m2) | Maximum current efficiency (cd/A) | CIEy | Maximum external quantum efficiency (%) |
|---|---|---|---|---|
| Device 1 | 465 | 38.6 | 0.22 | 20.4 |
| Device 2 | 564 | 37.3 | 0.22 | 19.8 |
| Device 3 | 587 | 39.1 | 0.22 | 23.9 |

The invention obtains a series of dark blue thermally activated delayed fluorescence materials with remarkable TADF characteristics through the combination of different functional groups, and the synthetic scheme designs are reasonable, obtaining a great synthesis efficiency of the target materials.

In addition, the organic electroluminescent device prepared by using the dark blue thermally activated delayed fluorescence material according to the present invention has high luminous efficiency and excellent device effect.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A dark blue light thermally activated delayed fluorescence (TADF) material; comprising at least one of a Compound 1 and a Compound 2 having a molecular structures respectively as follows:

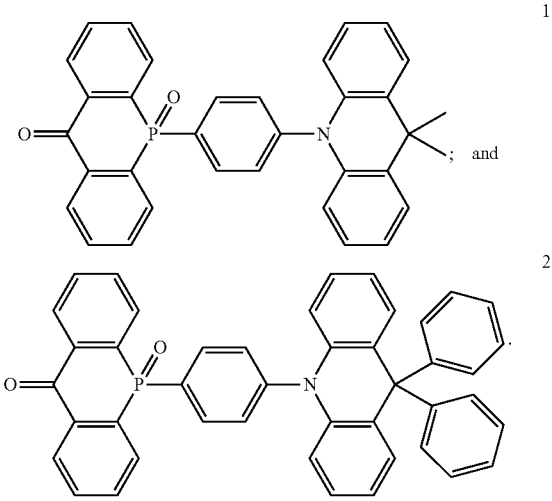

2. The dark blue light thermally activated delayed fluorescence (TADF) material according to claim 1, wherein the Compound 1 is formed by reacting an intermediate with 9,10-dihydro-9,9-dimethylacridine, wherein a molecular structure of the intermediate is as follows:

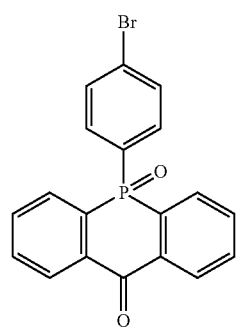 [SMILES: O=C1c2ccccc2P(=O)(c2ccc(Br)cc2)c2ccccc21]

wherein the Compound 1 is formed by a reaction scheme as follows:

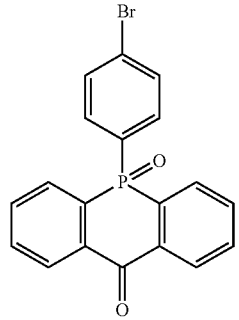

+

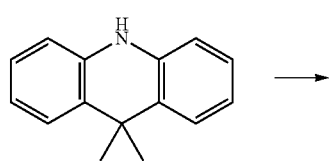

→

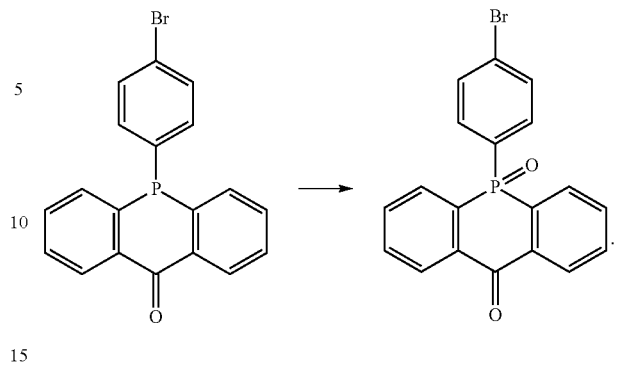

5. The dark blue light thermally activated delayed fluorescence (TADF) material according to claim 2, wherein the 9,10-dihydro-9,9-dimethyl acridine is derivatized as 9,10-dihydro-9,9-diphenyl acridine, which is reacted with the intermediate such that the Compound 1 is derivatized as a Compound 2 having a molecular structure as follows:

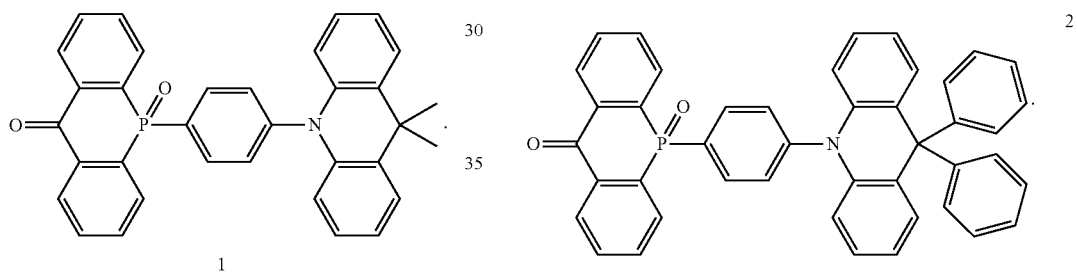

3. The dark blue light thermally activated delayed fluorescence (TADF) material according to claim 2, wherein the intermediate is formed from 4-bromophosphonone, with a molecular structure as follows:

6. The dark blue light thermally activated delayed fluorescence (TADF) material according to claim 5, wherein the Compound 2 is formed by a reaction scheme as follows:

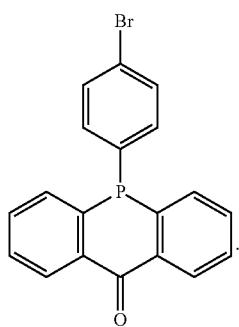 [SMILES: O=c1c2ccccc2p(-c2ccc(Br)cc2)c2ccccc12]

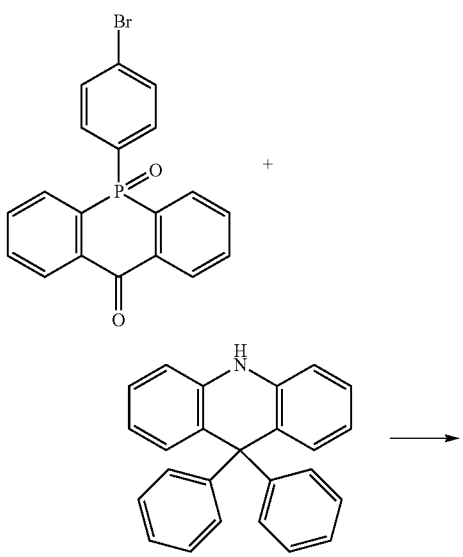

4. The dark blue light thermally activated delayed fluorescence (TADF) material according to claim 3, wherein the intermediate is formed by a reaction scheme as follows:

-continued

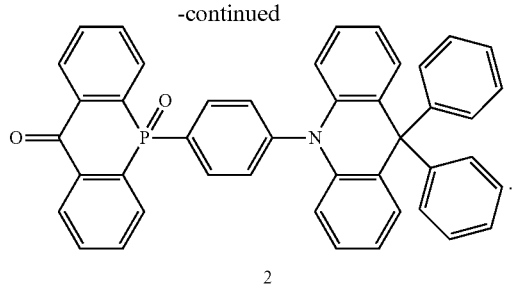

2

7. The dark blue light thermally activated delayed fluorescence (TADF) material according to claim 2, wherein the 9,10-dihydro-9,9-dimethyl acridine is derivatized as 9,10-dihydro-9,9-diphenylsilyl acridine, which is reacted with the intermediate such that the Compound 1 is derivatized as a Compound 3 having a molecular structure as follows:

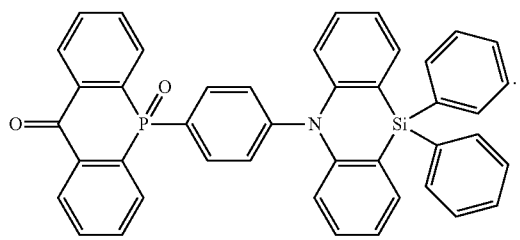

3

8. The dark blue light thermally activated delayed fluorescence (TADF) material according to claim 7 wherein the Compound 3 is formed by a reaction scheme as follows:

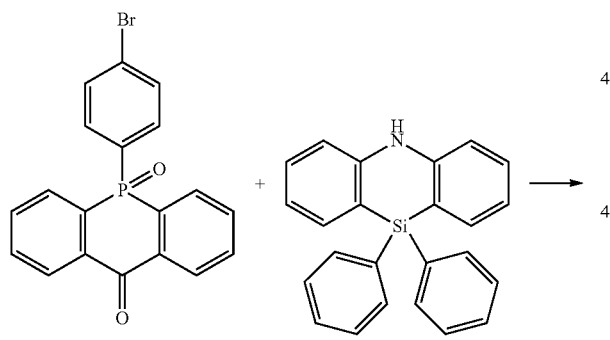

-continued

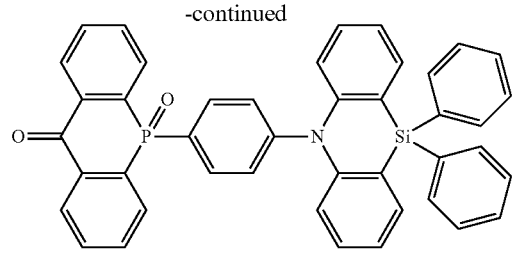

3

9. An electroluminescent device comprising a light-emitting layer; wherein a material of the light-emitting layer comprises at least one of Compound 1, Compound 2 and Compound 3 having molecular structures respectively as follows:

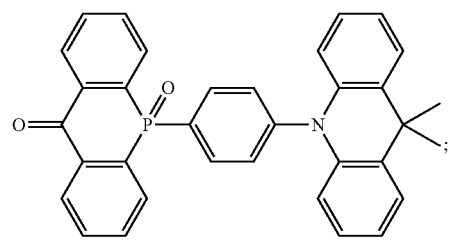

1

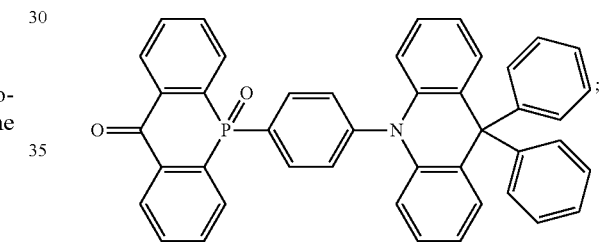

2

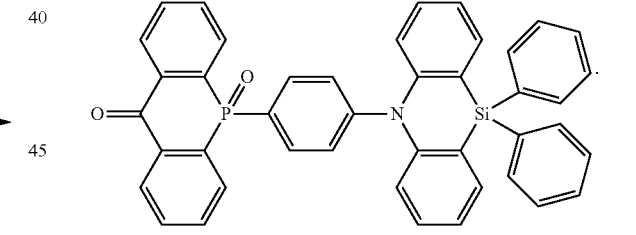

3

* * * * *